(12) United States Patent
Moll et al.

(10) Patent No.: US 6,314,156 B1
(45) Date of Patent: Nov. 6, 2001

(54) SPACE-EFFICIENT MULTI-CYCLE BARREL SHIFTER CIRCUIT

(75) Inventors: Laurent René Moll, Sunnyvale, CA (US); Michael D. Mitzenmacher, Belmont, MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/517,369

(22) Filed: Mar. 2, 2000

(51) Int. Cl.[7] .................................................. G11C 19/00
(52) U.S. Cl. .................................. 377/64; 377/69; 377/77
(58) Field of Search .................................. 377/64, 69, 77, 377/78; 708/209; 341/69, 95

(56) References Cited

U.S. PATENT DOCUMENTS

| | | | |
|---|---|---|---|
| 4,962,500 | * 10/1990 | Nakagawa | 365/201 |
| 5,465,223 | * 11/1995 | Nishimura | 708/209 |
| 5,532,949 | * 7/1996 | Fujihara | 708/209 |
| 5,555,202 | * 9/1996 | Chu | 708/209 |
| 5,761,266 | 6/1998 | Watts, Jr. | 377/81 |
| 6,078,937 | * 6/2000 | Vatinel | 708/209 |

* cited by examiner

Primary Examiner—Tuan T. Lam
(74) Attorney, Agent, or Firm—Fenwick & West LLP

(57) ABSTRACT

A space-efficient, multi-cycle barrel shifter circuit for shifting data inputted into the circuit by a shift value over multiple clock cycles which circuit includes: (a) a load module adapted to receive a load signal and the data, the load module coupled to the shift module and configured to load the data into the shift module upon receipt of a load signal; (b) a register module coupled to the shift module and to the load module, where the register module is a register adapted to receive a clock signal and configured to pass the data through the shift module with each clock cycle; (c) a constant shift module coupled to the register module and the shift module and configured to shift the data by a constant amount with each clock cycle; and (d) a control module coupled to the shift module and the load module, the control module capable of generating a command signal for each elementary shifter in the shift module for each clock cycle based upon the shift value, the command signal determining the amount of shift applied to the data by the shift module during each clock cycle so that the total amount of shift applied to the data after multiple clock cycles equals the shift value.

27 Claims, 12 Drawing Sheets

$$(0,1) \equiv$$
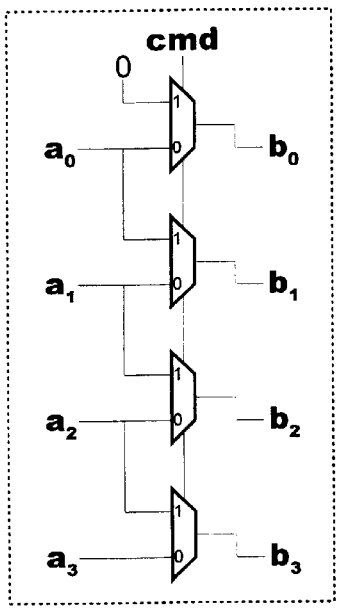
"Left shift"
Figure 3A
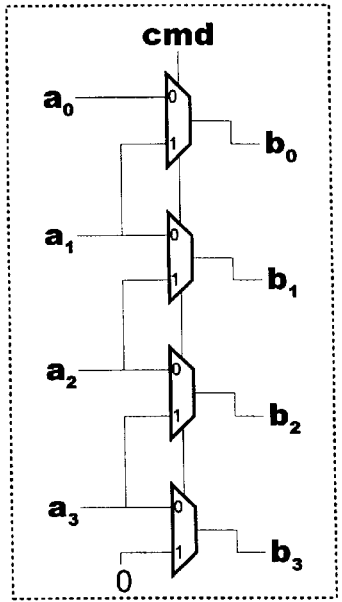
"Right shift"
Figure 3B
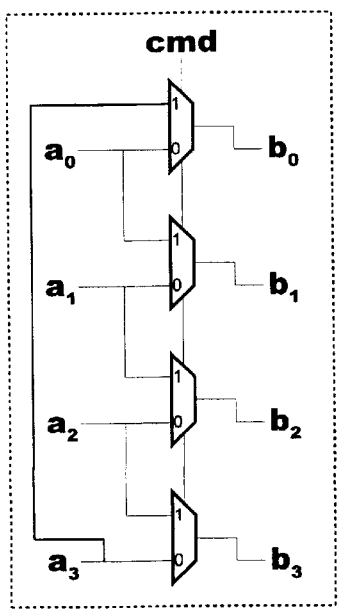
"Left rotate"
Figure 3C
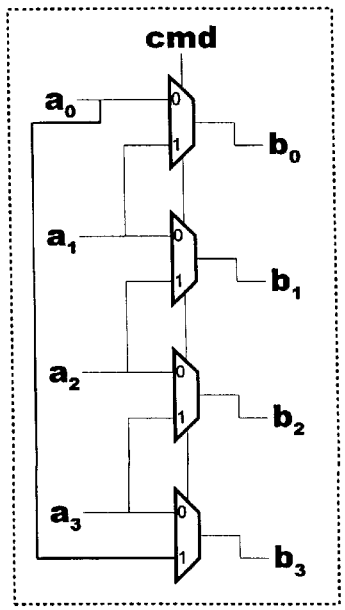
"Right rotate"
Figure 3D
Figure 3

SPACE-EFFICIENT MULTI-CYCLE BARREL SHIFTER CIRCUIT

TECHNICAL FIELD

This invention pertains to the field of shifting digital data using combinatorial logic called "barrel shifters."

BACKGROUND ART

A barrel shifter takes a data and a shift value as input and outputs the data shifted by the shift value. Conventional barrel shifters exist; however, conventional barrel shifters are typically implemented using fully combinatorial logic and perform the shift in a single cycle. Such conventional barrel shifters have several disadvantages.

First, the conventional, single cycle, fully combinatorial barrel shifters use more gates and take up more space on silicon than a smaller barrel shifter that uses less combinatorial logic.

Second, if the digital system in which the barrel shifter resides has multiple clock cycles to perform the shift operation, then the conventional barrel shifter is only being used at a fraction of its capacity if such conventional barrel shifter completes the task of shifting within a single clock cycle.

Given the foregoing, there is a need for a barrel shifter circuit that is space-efficient and that takes advantage of multiple clock cycles in order to perform the required shift operation.

SUMMARY OF THE INVENTION

The present invention includes a space-efficient multi-cycle barrel shifter circuit for shifting data by the inputted shift value. The present invention takes advantage of multiple clock cycles in order to perform the required shift. Rather than using a fully combinatorial, single cycle implementation of a barrel shifter, the present invention uses a barrel shifter circuit that is reduced in size and combinatorial logic, but that passes the data to be shifted through such barrel shifter circuit multiple times (once per clock cycle) with different, or in some cases the same, shift values. The sum of the shift value for each clock cycle will be the global shift applied to the data at a conclusion of a multi-cycle sequence. As the data is passed multiple times through the shifter circuit, the amount of shift after multiple passes (i.e., multiple clock cycles) will be greater than the amount of shift permissible from a single pass. Thus, the result is a space-efficient multi-cycle barrel shifter circuit.

A space-efficient multi-cycle barrel shifter circuit in accordance with the present invention may include a shift module, a load module, a register module and a control module, where the control module is coupled to the load module and the shift module, where the shift module is coupled to the register module and the load module, and where the register module is coupled to the load module. The shift module includes a shifter circuit that is smaller and uses less combinatorial logic than the conventional, fully combinatorial, single cycle implementation of a barrel shifter. The load module loads the data to be shifted into the barrel shifter circuit. The register module assists with passing the data to be shifted through the shift module once for each clock cycle. The control module computes the amount of shift imparted to the data through each cycle of the clock.

BRIEF DESCRIPTION OF THE DRAWINGS

These and other more detailed and specific advantages and features of the present invention are more fully disclosed in the following specification, reference being made to the accompanying drawings, in which:

FIGS. 3A–3D illustrate block diagrams of four embodiments of a four bit wide elementary shifter that can shift its input by zero or one bit.

DETAILED DESCRIPTION OF THE PREFERRED EMBODIMENTS

Preferred embodiments of the present invention are now described with reference to the figures where like reference numbers indicate identical or functionally similar elements in the various figures. Also in the figures, the left-most digits of each reference number corresponds to the figure in which the reference number is first used. The present invention relates to a space-efficient, multi-cycle barrel shifter circuit.

Figure 1:
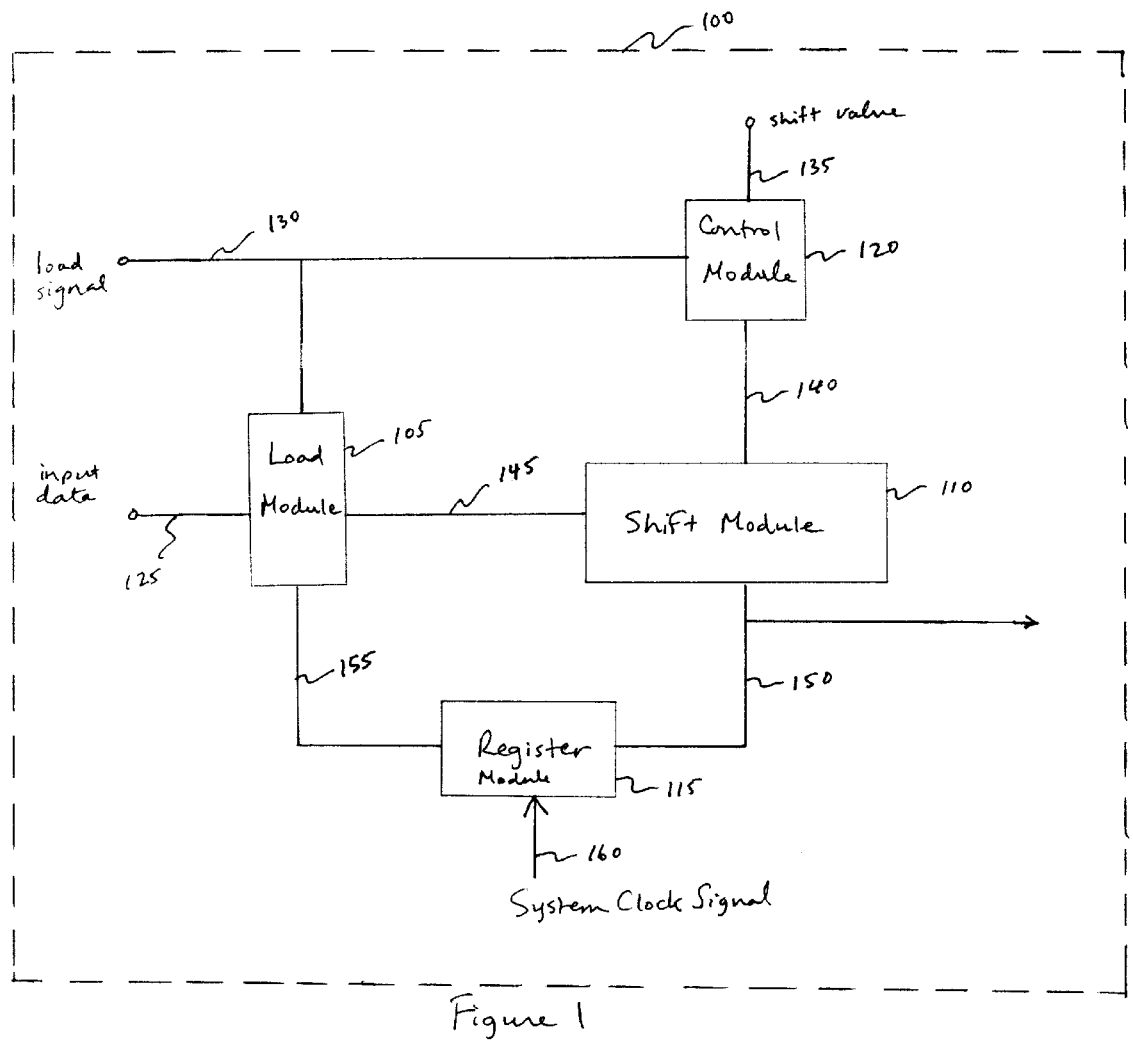
FIG. 1 is a block diagram of a barrel shifter circuit in accordance with a first embodiment of the present invention.

FIG. 1 is a block diagram of a barrel shifter circuit in accordance with the first embodiment of the present invention. The barrel shifter circuit 100 includes a shift module 110, a load module 105, a register module 115 and a control module 120. The barrel shifter circuit 100 has one output 150 and several inputs: a data input 125, a load signal 130, a shift value 135 and a system clock signal 160. The shift module 110 shifts its input data 145 by the amount of the value 140. Upon receipt of the load signal 130, the load module 105 loads the input data 125 into the shift module 110. The register module 115 cycles its input 150 through the shift module 110 with each clock cycle, and the control module 120 takes the shift value 135 as input and computes the amount of shift imparted by the shift module 110 during each clock cycle to achieve the desired total shift. At the end of several clock cycles, the output 150 of the barrel shifter circuit 100 delivers the result of the input data 125 shifted by the shift value 135.

Figure 2:
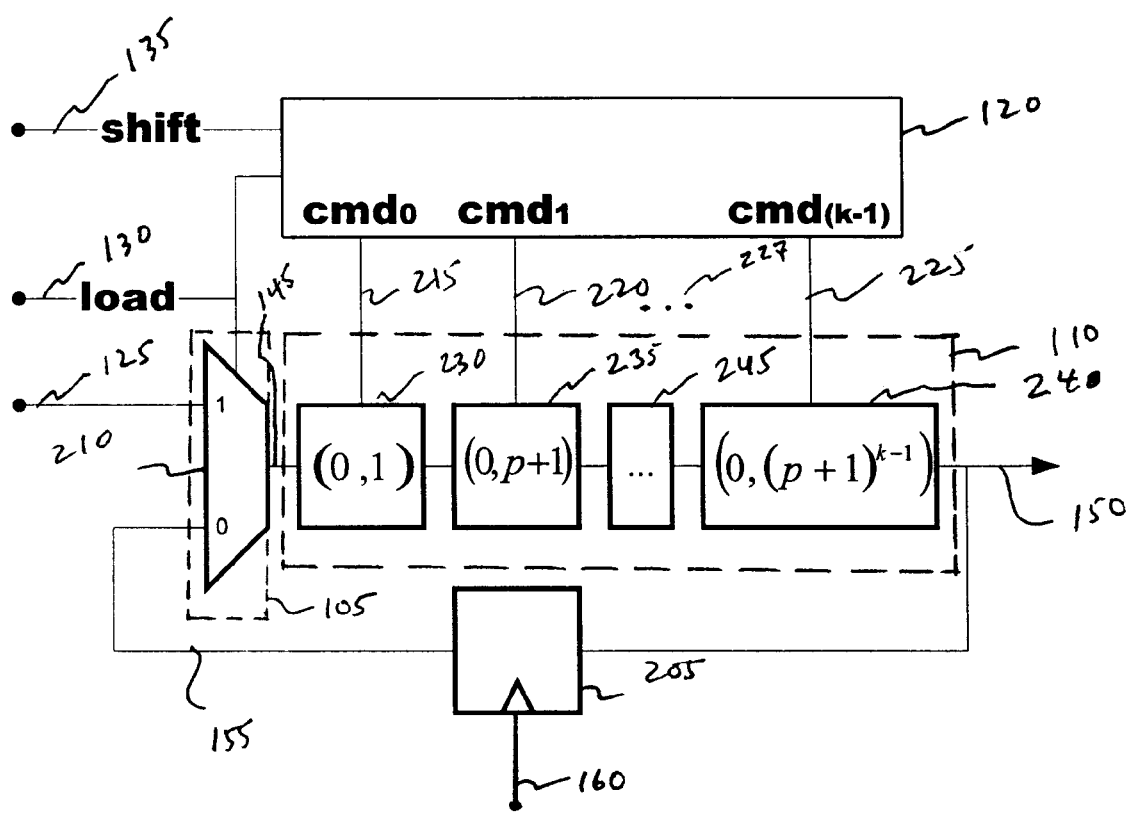
FIG. 2 is a block diagram of a preferred embodiment of the first embodiment of the barrel shifter circuit of the present invention.

FIG. 2 illustrates a block diagram of a preferred embodiment of the first embodiment of the barrel shifter circuit of the present invention. The load module 105 includes a multiplexer 210 whose inputs are the load signal 130, the input data 125 and the output 155 of the register module 115. The output of the load module 145 is coupled to the shift module 110. If the load signal 130 is one, the load module 105 loads new data into the shift module 110. If, on the other hand, the load signal 130 is zero, the output 155 of the register module 115, which contains data previously loaded into and shifted by the shift module 110, gets passed through the shift module 110 again on the next clock cycle.

As shown in FIG. 2, the register module 115 includes at least one register 205 adapted to receive a clock signal 160, one register per bit of output 150 from the shift module 110. The register module 115 is coupled to the load module 105 and the shift module 110 passes the data to be shifted through the shift module 110 with each clock cycle.

Also shown in FIG. 2 is the shift module 110. The shift module 110 includes one or more elementary shifters linked together serially and receives command signals, cmd, from the control module 120 and the output 145 from the load module 105. In the example of FIG. 2, the shift module 110 includes elementary shifters 230, 235 and 240. However, as discussed below, the number of elementary shifters in shift module 110 may vary. Furthermore, the block 245 is shown to indicate that the elementary shifters are scalable. Additionally, the command signals, $cmd_0$, $cmd_1$, . . . , $cmd_{(k-1)}$, are represented by signals 215, 220 and 225 respectively. As shown by dots 227, the number of command signals varies depending upon the number of elementary shifters, one command signal per elementary shifter.

Each elementary shifter is capable of shifting its input by zero bits or n bits depending upon the configuration of the elementary shifter and the value of the corresponding command signal, cmd, inputted into the elementary shifter, wherein n is a positive integer. An elementary shifter can be implemented as a combination of multiplexers and fixed shifters as discussed below in reference to FIG. 3. Multiplexers are logic elements that take two data inputs and a command bit. Depending upon the value of the command bit, the output will be equal to either one of the data input. Fixed shifters may be implemented in hardware by simply connecting wires according to a specific configuration. No combinatorial logic is needed.

FIG. 3 illustrates block diagrams of four embodiments of a four bit wide elementary shifter that can shift its input by zero bits when cmd equals zero or one bit when cmd equals one. An elementary shifter capable of shifting a four bit data input may be implemented using four multiplexers configured in the manner illustrated in FIG. 3. An elementary shifter capable of shifting the input by zero or one bit is hereafter represented symbolically as (0, 1). An elementary shifter capable of shifting the input by zero or n bits is hereafter represented symbolically as (0, n). FIG. 3A illustrates a four bit "left shift" elementary shifter which adds a zero to the least significant bit of the inputted data when cmd equals one. In other words, as shown in FIG. 3A, if cmd=1, $(b_0, b_1, b_2, b_3)=(0, a_0, a_1, a_2)$, and if cmd=0, $(b_0, b_1, b_2, b_3)=(a_0, a_1, a_2, a_3)$. FIG. 3B illustrates a four bit "right shift" shifter which adds a zero to the most significant bit of the inputted data when cmd equals one. In other words, as shown in FIG. 3B, if cmd=1, $(b_0, b_1, b_2, b_3)=(a_1, a_2, a_3, 0)$, and if cmd=0, $(b_0, b_1, b_2, b_3)=(a_0, a_1, a_2, a_3)$. FIG. 3C illustrates a four bit "left rotate" elementary shifter which, rather than adding a zero to the least significant bit, adds or rotates the most significant bit of the input data to the least significant bit of the output data. In other words, if cmd=1, $(b_0, b_1, b_2, b_3)=(a_3, a_0, a_1, a_2)$, and if cmd=0, $(b_0, b_1, b_2, b_3)=(a_0, a_1, a_2, a_3)$. FIG. 3D illustrates a four bit "right rotate" elementary shifter which, rather than adding a zero to the most significant bit, adds or rotates the least significant bit of the input data to the most significant bit of the output data. In other words, if cmd=1, $(b_0, b_1, b_2, b_3)=(a_1, a_2, a_3, a_0,)$, and if cmd=0, $(b_0, b_1, b_2, b_3)=(a_0, a_1, a_2, a_3)$.

If the shift module 110 shown in FIG. 1 consisted only of a single elementary shifter, (0, 1), and there are thirty one clock cycles available, the barrel shifter circuit 100 of the present invention would be capable of shifting the input from zero to thirty one bits. After all, the input could be shifted by either zero or one bit each clock cycle, and after thirty one clock cycles, the data could be shifted by any value between zero and thirty one bits.

If the number of clock cycles equals p, the number of elementary shifters available is k, and the sequence of load signals is one on each input data then zero for p−1 clock cycles, one can optimize the range of shift offered by the barrel shifter circuit 100 by linking together the elementary shifters in the following configuration $(0, 1)+(0, p+1)+(0, (p+1)^2+\ldots +(0, (p+1)^{(k-1)})$, as shown in FIG. 2. Using the configuration shown in FIG. 2 allows for $(p+1)^{(k-1)}$, consecutive possible shifts and is a preferred embodiment of the first embodiment of the present invention.

Figure 4:
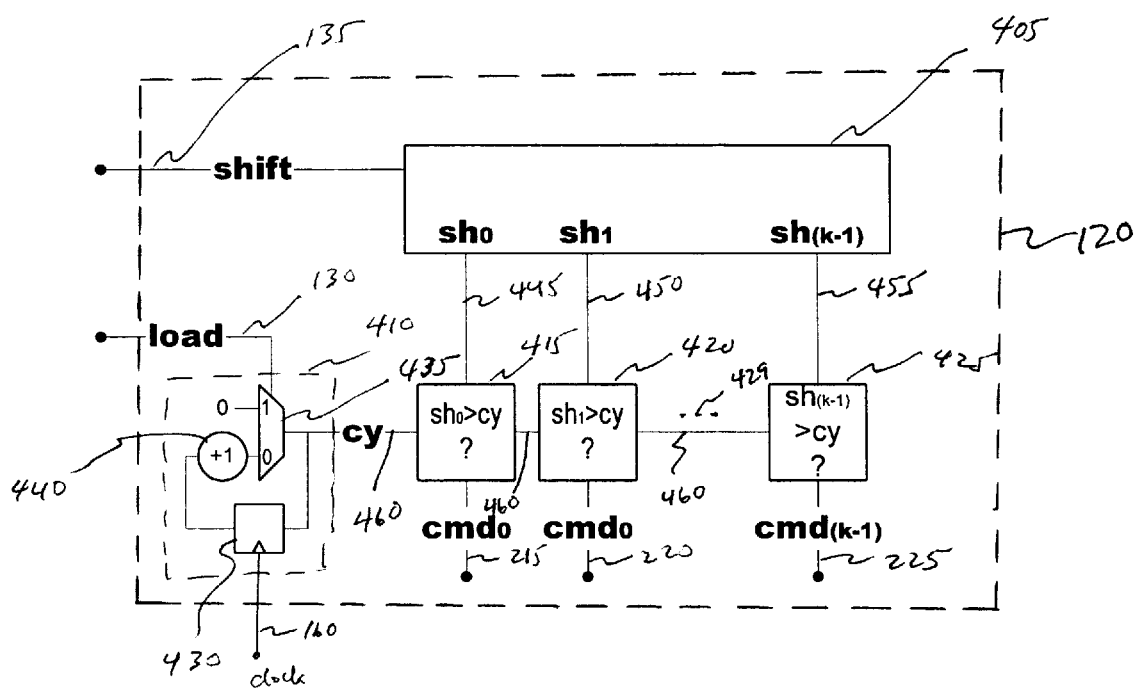
FIG. 4 is a block diagram of the control module in accordance the first embodiment of the present invention.

FIG. 4 is a block diagram of the control module 120 in accordance with the first embodiment of the present invention. The control module 120 comprises: (1) a decomposing module 405 configured to decompose the shift value 135 into one or more intermediate shift values, $sh_0, sh_1, \ldots, sh_{(k-1)}$, corresponding to 445, 450 and 455 respectively; (2) one or more comparators 415, 420 and 425, each comparator adapted to receive an output 460, cy, of a clock counter 410 of clock cycles and a corresponding intermediate shift value; and (3) a counter 410 of clock cycles whose output 460, cy, is coupled to each of the comparators 415, 420 and 425, and which is adapted to receive the load signal 130 and a clock signal 160. Each comparator 415, 420 and 425 outputs a command signal, $cmd_0, cmd_1, \ldots, cmd_{(k-1)}$, shown as 215, 220 and 225 respectively in FIG. 4. The ellipse 429 indicates that the number of comparators and intermediate shift values is variable, depending upon the number of elementary shifters in the shift module 110.

The decomposing module 405 performs the function of converting the shift value 135 into k binary numbers in the interval 0 through p, or, more precisely, [0 . . . p], where k is the number of elementary shifters in the shift module 110. These k binary numbers are $sh_0, sh_1, \ldots, sh_{(k-1)}$ and are referred to as intermediate shift values above. These intermediate shift values may be computed using the following formula:

$$sh_i=[shift/(p+1)^i]\%(p+1)$$

where "shift" is the shift value 135, "/" means integer division, "%" means modulo, i equals an integer value from 0 to k−1, shift equals the shift value 135 and p equals the total number of available clock cycles. In short, the k binary intermediate shift values depend upon the shift value 135, the number of elementary shifters k, and the number of available clock cycles p.

Each comparator 415, 420 and 425 compares its input, respectively 445, 450 and 455, with cy. If the input to a comparator, $sh_i$, is greater than cy, then the output of such comparator is one. Note that the outputs of the comparators 415, 420 and 425 are the inputs to the elementary shifters 230, 235 and 240 respectively. Thus, if the input 215 to elementary shifter 230 is one, elementary shifter 230 will shift its input data by one bit for a single clock cycle. If the input 215 is zero, elementary shifter 230 will shift its input data by zero bits for such clock cycle. Similarly, if the input 220 to elementary shifter 235 is one, elementary shifter 235 will shift its input data by (p+1) for a given clock cycle. If the input 220 is zero, elementary shifter 235 will shift its input data by zero bits for such clock cycle. Also, if input 225 to elementary shifter 240 is one, elementary shifter 240 will shift its input data by $(p+1)^{(k-1)}$ for a given clock cycle; otherwise, elementary shifter 240 will shift its data by zero bits for such clock cycle.

As further illustrated in FIG. 4, the counter 410 comprises at least one register 430, an incrementer 440 coupled to the register 430, and a multiplexer 435 coupled to the incrementer 440, the register 430, and the comparators 415, 420 and 425. The counter 410 is capable of counting clock cycles in the digital circuit in which the barrel shifter circuit resides.

Figure 5:
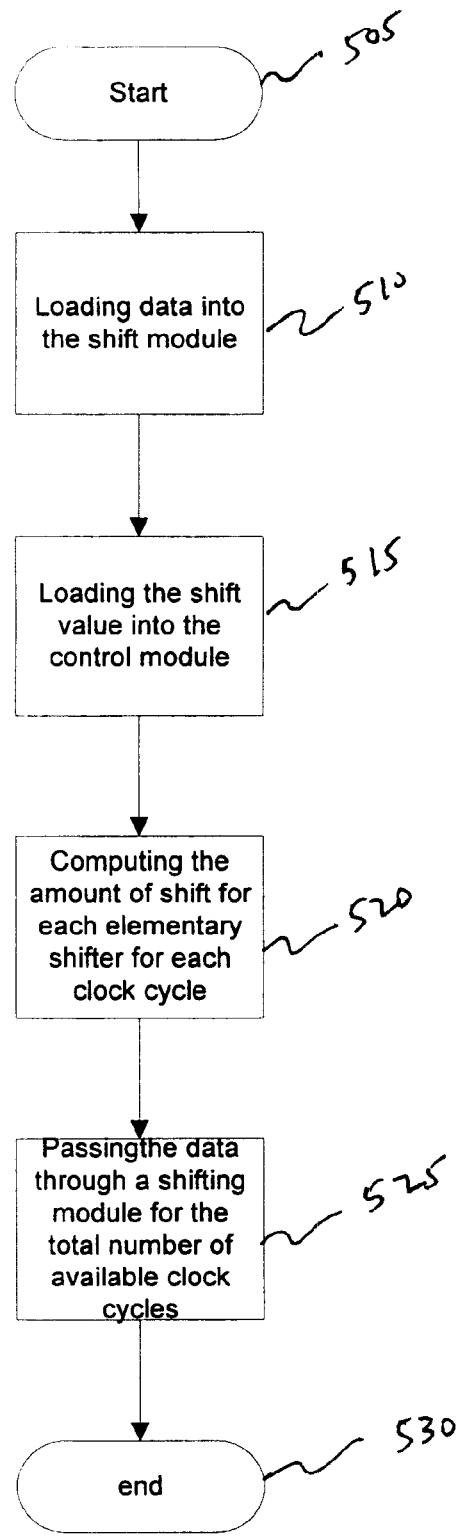
FIG. 5 is a flow diagram illustrating one method of operation of the first embodiment of the present invention.

FIG. 5 is a flow diagram illustrating one method of operation of the first embodiment of the present invention. At the start 505 of the operation, which occurs upon receipt of the load signal 130, the load module 105 loads 510 the input data 125 into the shift module 110 and the shift value 135 gets loaded 515 into the control module 120 of the barrel shifter circuit 100. For each clock cycle, the control module 120 computes 520 an amount of shift 215, 220 and 225 for each elementary shifter 230, 235 and 240, respectively. The amount of shift 215, 220 and 225 computed for each clock cycle by the control module 120 is shown as command signals, $cmd_0$, $cmd_1$, and $cmd_{(k-1)}$, respectively, in FIG. 2. The input data 125 then passes 525 through the shift module 110 for the total number of available clock cycles, p, until a new input data is loaded into the barrel shifter circuit 100. The command signals, $cmd_0$, $cmd_1$, and $cmd_{(k-1)}$, determine the amount of shift imparted by each elementary shifter to the data per clock cycle. The end result of passing 525 the input data 125 through the shift module 110 for p cycles is the input data 125 shifted by the shift value 135.

Figure 6:
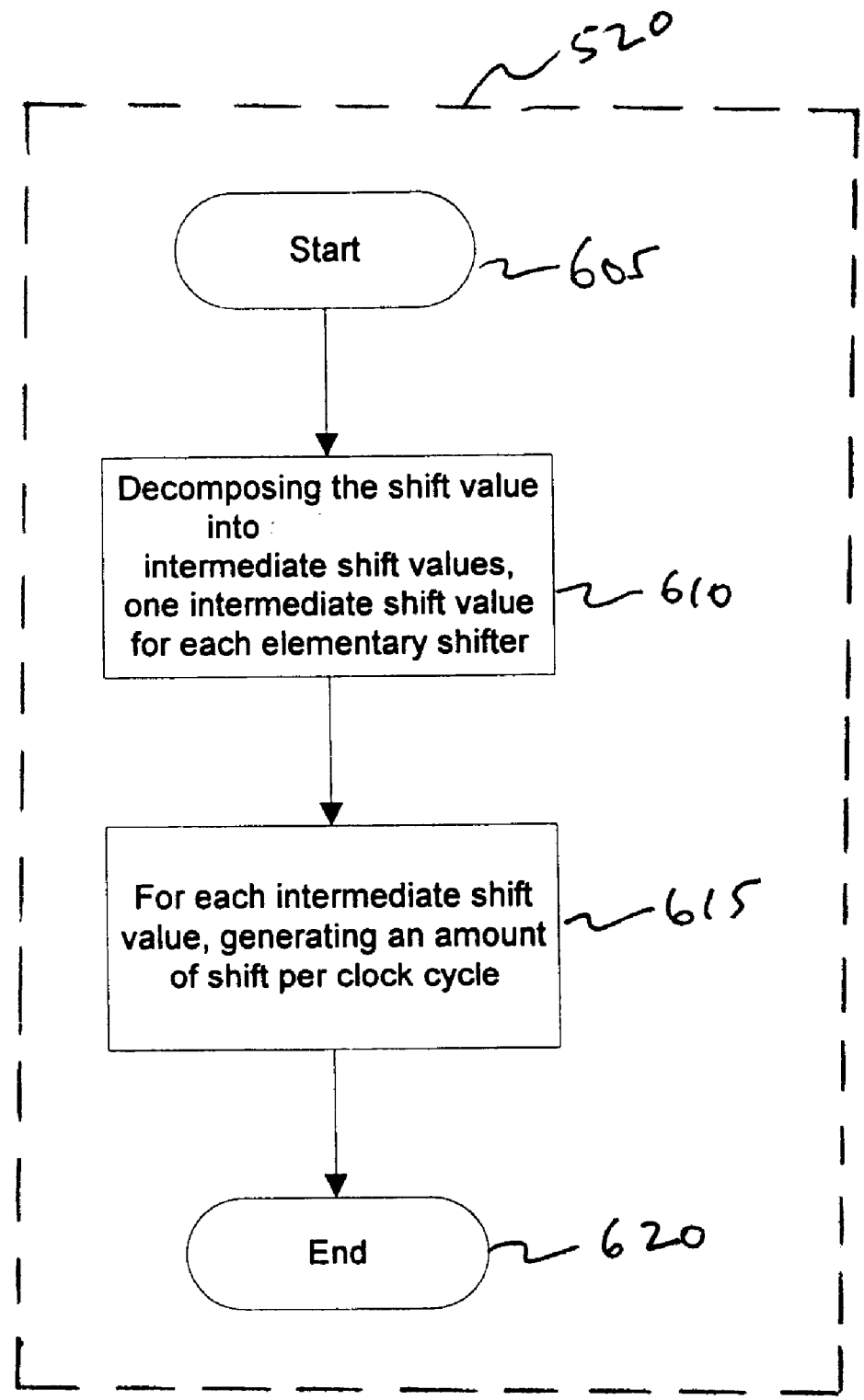
FIG. 6 is a flow diagram illustrating one method of computing an amount of shift for each elementary shifter for each clock cycle in the first embodiment of the present invention.

FIG. 6 is a flow diagram illustrating one method of computing an amount of shift for each elementary shifter for each clock cycle in the first embodiment of the present invention. At the start of the computation 605, the module for decomposing the shift value 405 decomposes 610 the shift value 135 into intermediate shift values 445, 450 and 455, also shown as $sh_0$, $sh_i$ and $sh_{(k-1)}$ respectively, in FIG. 4, one intermediate shift value for each elementary shifter. The other portions of the control module (i.e., comparators 415, 420 and 425, and the counter 410) then generate 615, for each elementary shifter based upon its associated intermediate shift value, an amount of shift per clock cycle 215, 220 and 225, also shown as $cmd_0$, $cmd_1$, and $cmd_{(k-1)}$, respectively, in FIG. 4. The command signals, $cmd_0$, $cmd_1$, and $cmd_{(k-1)}$, generated by the control module 120 produce values so that the total amount of shift produced by all elementary shifters 230, 235 and 240 in shift module 110 after p cycles, the total number of available cycles, equals the shift value 135.

Figure 7:
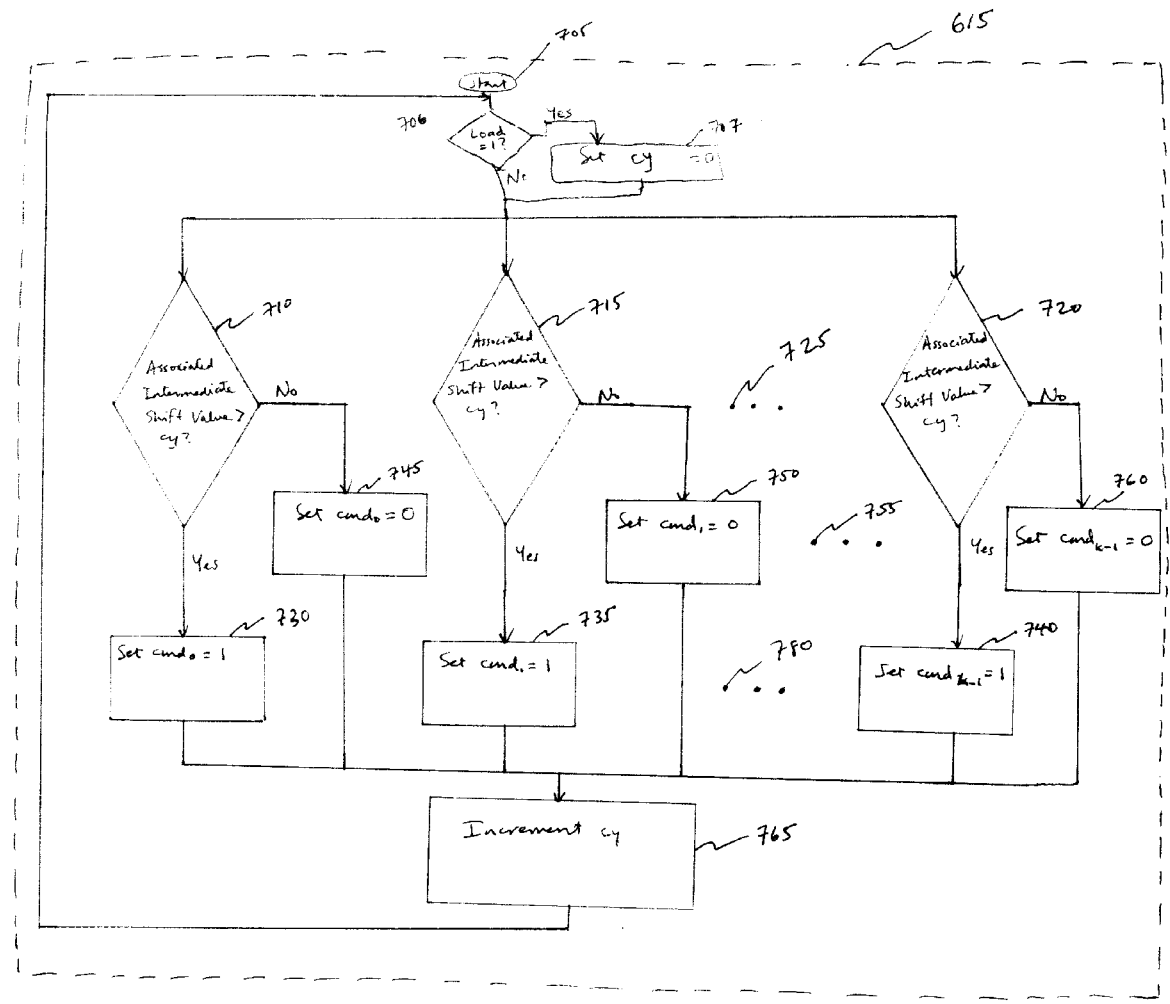
FIG. 7 is a flow diagram illustrating one method of generating a command value for each elementary shifter for each clock cycle based upon the associated intermediate shift value in the first embodiment of the present invention.

FIG. 7 is a flow diagram illustrating one method of generating a command value, cmd, for each elementary shifter for each clock cycle based upon the associated intermediate shift value in the first embodiment of the present invention. At the start of the operation 705, a multiplexer 435 checks 706 if load signal 130 equals one. If load signal 130 equals one, the counter 410 of clock cycles sets 707 its output 460, cy, to zero. Next, comparators 415, 420 and 425 compare, respectively, intermediate shift values, $sh_0$, $sh_1$, ... $sh_{(k-1)}$, 710, 715 and 720 respectively, to cy. If the intermediate shift value associated with an elementary shifter is greater than cy, the associated command value, $cmd_i$, is set to one 730, 735 and 740. Otherwise, the command value is set to zero 745, 750 and 760. Next, the counter 410 of clock cycles increments 765 its output 460 by one. The steps described in this paragraph, then repeat themselves again. Note that ellipses 725, 755 and 780 indicate that the number of intermediate shift values, comparators and command value is variable, depending upon the number of elementary shifters in the shift module 110.

Figure 8:
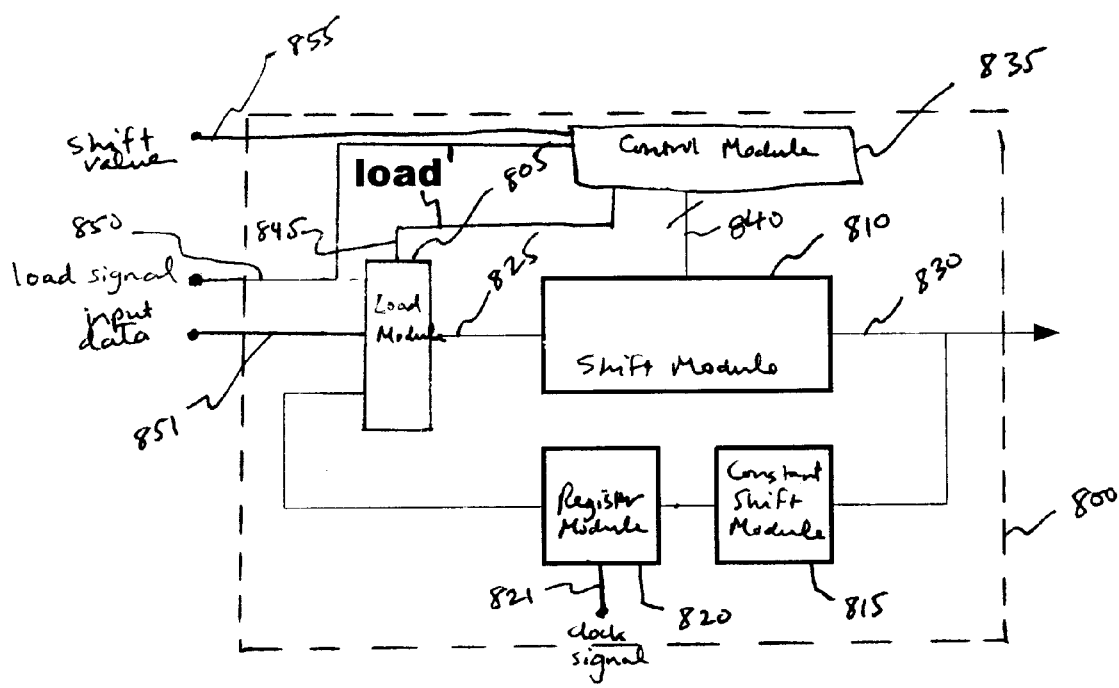
FIG. 8 is a block diagram of a barrel shifter circuit in accordance with a second embodiment of the present invention.

FIG. 8 illustrates a block diagram of a barrel shifter circuit in accordance with the second embodiment of the present invention. The barrel shifter circuit 800 includes, in addition to a load module 805, a shift module 810, a control module 835 and register module 820, a constant shift module 815 in the feedback loop. If the input data 851 is present for p clock cycles, then the inclusion of a constant shift module 815 in the feedback loop of the circuit 800 increases the range of shift without requiring additional combinatorial logic. More specifically, by having the ability to load the input data 851 at any clock cycle (not just the first one), the circuit 800 is capable of shifting the input data 851 by a greater number of bits with the same amount of combinatorial logic in the shift module 810 (and only slightly more combinatorial logic in the control module 835) because the constant shift module 815 adds shift in addition to the shift provided by the shift module 810.

As illustrated in FIG. 8, the second embodiment 800 of the barrel shifter circuit has one output 830 and several inputs: an input data 851, a load signal 850, a shift value 855 and a clock signal 821. The shift module 810 shifts its input data 825 by the amount of the value 840. Upon receipt of the load' signal 845, the load module 805 loads the input data 851 into the shift module 810. The register module 820 cycles the output 830 of the shift module 810 through the shift module 810 and the constant shift module 815 with each clock cycle, and the control module 835 takes the shift value 855 as input and computes the amount of shift imparted by the shift module 810 during each clock cycle to achieve the desired total shift. At the end of several clock cycles, in particular p clock cycles, the output 830 of the barrel shifter circuit 800 delivers the result of the input data 851 shifted by the shift value 855.

In FIG. 8, the shift module 810 and the register module 820 may be identical to the shift module 110 and the register module 115, respectively, contained in FIG. 1. As with the first embodiment of the barrel shifter circuit 100 illustrated in FIG. 1, a desirable configuration for the shift module 810 shown in FIG. 8 if one uses k elementary shifters and has p clock cycles is as follows: $(0, 1)+(0, p+1)+(0, (p+1)^2)+(0, (p+1)^3)+\ldots+(0, (p+1)^{(k-1)})$. The addition of a constant shift module 815 to the configuration described in the preceding sentence allows for $(p+1)^k+n(p-1)-1$ possible consecutive shifts, rather than simply $(p+1)^{(k-1)}$ consecutive shifts, where n is the amount of shift provided by the constant shift module in a single clock cycle. Note that even if the input data 825 is present for less than p clock cycles, but more than one clock cycle, the inclusion of a constant shift module 815 in the feedback loop of the circuit 800 still increases the range of shift without requiring additional combinatorial logic, albeit the range of increase would be less than it would be if the input data 825 were present for the full p clock cycles. The constant shift module 815 may be implemented in one embodiment using fixed shifters.

The load module 805 is similar to the load module 105, except that one of the inputs to the load module 805 is the load' signal 845 rather than the load signal 850.

Figure 9:
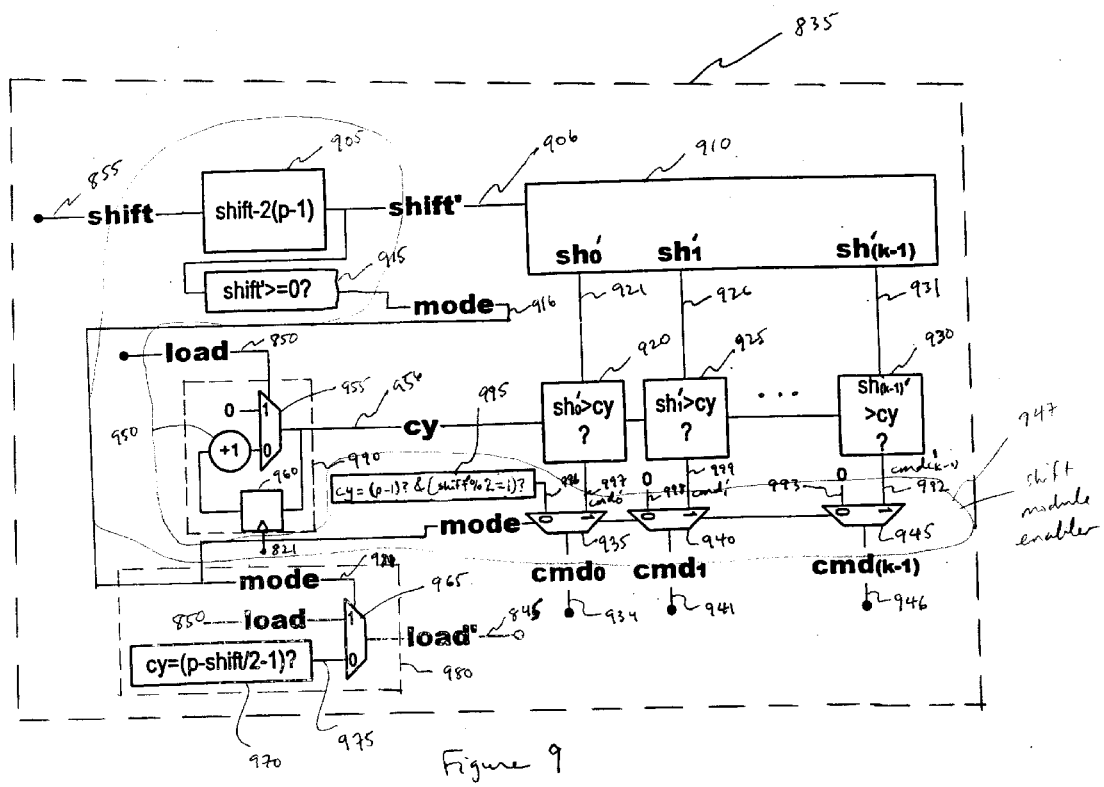
FIG. 9 is a block diagram of the control module in accordance with the second embodiment of the present invention, where the constant shift equals two.

FIG. 9 is a block diagram of the control module 835 in accordance with the second embodiment of the present invention, where the constant shift equals two. As a note, the constant shift need not equal two, but may equal any non-negative integer. The control module 835 includes: (1) a decomposing module 910 configured to decompose shift' into at least one intermediate shift value, $sh_0'$, $sh_1'$, ..., $sh_{(k-1)}'$, corresponding to 921, 926 and 931 respectively; (2) at least one comparator 920, 925 and 930, each comparator adapted to receive an output 956, cy, of a clock counter 990 of clock cycles and a corresponding intermediate shift value 921, 926 and 931, respectively; (3) a counter 990 of clock cycles whose output 956, cy, is coupled to each of the comparators 920, 925 and 930, and which counter 990 is adapted to receive the load signal 850 and a clock signal 821; (4) a delay load module 980, adapted to receive a load signal 850, for computing a load' signal 845 which signals on which clock cycle the load module 805 loads the input data 851 into the shift module 810 to achieve the desired amount of shift; and (5) a shift module enabler 947 coupled to the counter 990, the comparators 920, 925 and 930, and capable of enabling the elementary shifters in the shift module 810 to produce the desired amount of shift. As shown in FIG. 9, comparators 920, 925 and 930 output command signals, $cmd_0'$, $cmd_1'$, ..., $cmd_{(k-1)}'$, shown as 997, 999 and 992 respectively, in FIG. 9. Shift' equals shift-n(p-1), where shift is the shift value 855 inputted in to the circuit, n equals the amount of shift imparted to the data by the constant shift module 815 in a single clock cycle, and p is the number of available clock cycles.

The decomposing module 910 performs the function of converting shift' 906 into k binary numbers in the interval 0 through p, or, more precisely, [0 ... p], where k is the number of elementary shifters in the shift module 810. These k binary numbers are $sh_0'$, $sh_1'$, ... $sh_{(k-1)}'$ and are referred to as intermediate shift values above. These intermediate shift values may be computed using the following formula:

$$sh_i' = [shift'/(p+1)^i]\%(p+1)$$

where "/" means integer division, "%" means modulo, p is the number of available clock cycles, i equals an integer value between 0 and k-1, shift' equals shift-n(p-1) and n equals the amount of shift imparted by the constant shift module 815 to the data in a single clock cycle.

Each comparator 920, 925 and 930 compares its input, respectively 921, 926 and 930, with the counter output 956. If the input to a comparator is greater than the counter output 956, then the output of such comparator shall be set to one. The counter 990 in FIG. 9 is identical to the counter 410 in FIG. 4 and is capable of counting clock cycles in the digital circuit in which the barrel shifter circuit resides. Note that the outputs of the comparators 920, 925 and 930 are the inputs to the shift module enabler 947.

The shift module enabler 947 as illustrated in FIG. 9 includes: (1) a mode compute module, collectively 905 and 915, for computing the value of mode 916; (2) at least one shift module multiplexer 935, 940 and 945, one shift module multiplexer for each elementary shifter in the shifter module 810; and (3) an enabler 995 for the most elementary shifter which is configured to add additional shift to the input data 851 during the penultimate clock cycle. As illustrated in FIGS. 2 and 8, the most elementary shifter is capable of adding a shift of zero or one bit, and is represented as (0, 1). Note the additional shift need not be added during the penultimate clock cycle only. It may be added during any clock cycle from 0 to p-2. The value of the enabler 995 for the most elementary shifter is one when clock cycle equals (p-2) and shift' modulo n does not equal zero (or, as in the case of FIG. 9, when shift' modulo two equals one). Otherwise the value of the enabler 995 for the most elementary shifter equals zero.

The shift module multiplexer 935 associated with the most elementary shifter in the shift module 810 (i.e., the elementary shifter capable of imparting the least amount of shift to the input data 851, which in the case of FIGS. 2 and 8 is (0, 1)) selects between two inputs, the first input being the output of the enabler 995 for the most elementary shifter and the second input being the output of the comparator 920 associated with the most elementary shifter, based upon a control signal whose value is mode 916. The other shift module multiplexers 940 and 945 similarly select between two inputs, the first input being zero 998 and 993, and the second input being the output of the associated comparators 925 and 930, respectively, based upon a control signal whose value is mode 916.

The foregoing configuration of the mode compute module 905 and 915, the shift module enabler 947, the comparators 920, 925 and 930, and the decomposing module 910, permit the following. If the amount of shift to be imparted to the input data 851 is greater than that which can be imparted by the constant shift module 815 during p clock cycles (i.e., mode equals one), then one or more of the elementary shifters must provide the additional shift. In such a case, the constant shift module 815 provides 2(p-1) shift, and the elementary shifters provide the remaining shift-2(p-1)= shift'. If the value of mode 916 equals one, the decomposing module 910, comparators 920, 925 and 930 and the shift module multiplexers 935, 940 and 945 operate in a manner to generate command values, cmd, which impart shift' on the input data 851.

If, however, the value of mode 916 equals zero, no additional shift need be imparted to the input data 851 beyond, perhaps, a shift of one if the constant shift module 815 adds an even amount of shift as illustrated in FIG. 9. Hence, each of the shift module multiplexers 940 and 945, except perhaps for the shift module multiplexer associated with the most elementary shifter 935, selects its first input whose value is zero, so that the elementary shifters other than the most elementary shifter do not add any additional shift. If, however, the constant shift module 815 imparts an even amount of shift such as two, then the most elementary shifter may need to add an additional shift of one bit to achieve the desired total shift if the desired total shift is an odd number. In such a case, the value of the additional delay enabler 995 would be one on the penultimate clock cycle and zero during all other clock cycles, thereby permitting the addition of a one bit shift. As noted above, the addition of the one bit shift need not occur during the penultimate clock cycle. It may occur at any point during the p clock cycles. Moreover, the amount of shift imparted by the constant shift module 815 need not be two as suggested in FIG. 9. If the amount of shift imparted by the constant shift module 815 is other than two, the enabler 995 for the most elementary shifter becomes enabled when shift' modulo n does not equal zero.

Finally, the delay load module 980 as illustrated in FIG. 9 includes: (1) a delay load comparator 970 for determining whether the current clock cycle equals the delay load value, where the delay load value is (p-shift/2−1), where p is the number of available clock cycles, shift is the shift value 855 and "/" means integer division; and (2) a delay load multiplexer 965 configured to select one of two inputs, the first input 850 being the value of load 850 and the second input 975 being the output of the delay load comparator 970, based upon a control signal 981 which has the value of mode 916. The value of mode 916 is one when shift' 906 is greater than or equal to zero, and zero otherwise. In the embodiment shown in FIG. 9, the value of shift' 906 is shift−2(p−1), where shift is the shift value 855 inputted into the circuit 800. Thus, given the amount of constant shift (two for the embodiment shown in FIG. 9) and the number of available clock cycles p, the delay load module 980 computes the number of times the input data 851 must be cycled through the constant shifter module 815 in order to achieve the desired amount of total shift 855. The delay load module 980 then compares the figure described in the preceding sentence with the output 956 of the counter 990 of clock cycles, and computes, based upon the load signal 850, a load' signal 845 which signals on which clock cycle the load module 805 should load the input data 851 into the shift module 810 to achieve the desired shift or a shift less than the desired shift, but no less than the amount of the constant shift.

Figure 10:
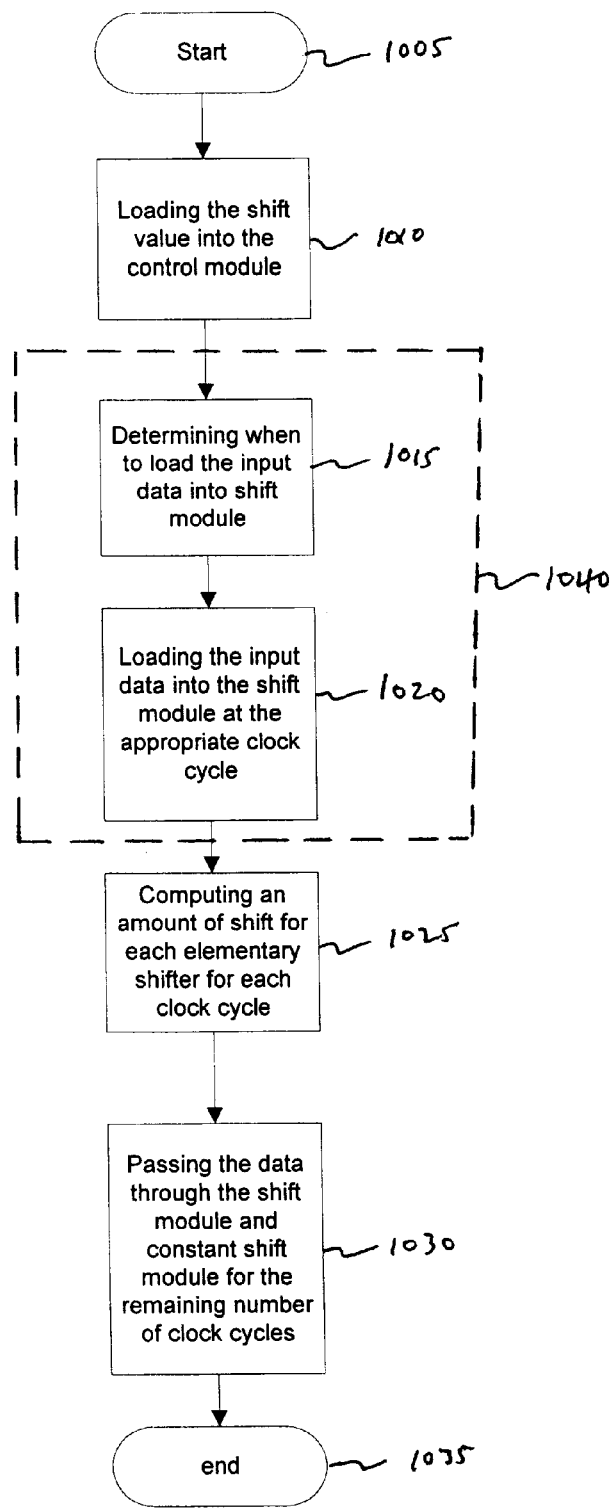
FIG. 10 is a flow diagram illustrating one method of operation of the second embodiment of the barrel shifter circuit of the present invention, which contains a constant shift module in the feedback loop.

FIG. 10 is a flow diagram illustrating one method of operation of the second embodiment of the barrel shifter circuit of the present invention, which contains a constant shift module 815 in the feedback loop. At the start 1005 of the operation, which occurs upon receipt of the load signal 850, the shift value 855 gets loaded 1015 into the control module 835 of the circuit 800. The delay load module 980 then determines 1015 at which clock cycle to load the input data 851 into the shift module 810 and loads 1020 the input data 851 at such appropriate clock cycle. For each clock cycle, the control module 835 computes 1025 an amount of shift 934, 941 and 946 for each elementary shifter. The amount of shift 934, 941 and 946 computed for each clock cycle by the control module 835 is shown as command signals, $cmd_0$ 934, $cmd_1$ 941 and $cmd_{(k-1)}$ 945 in FIG. 9. The input data 851 then passes 1030 through the shift module 810 and the constant shift module 815 for the remaining number of available clock cycles until a new input data is loaded into the circuit 800. The command signals, $cmd_0$, $cmd_1$ and $cmd_{(k-1)}$, determine the amount of shift imparted by each elementary shifter to the data per clock cycle. The end result of passing the input data 851 through the shift module 810 and the constant shift module 815 for the remaining number of clock cycles is the input data 851 shifted by the shift value 855.

Figure 11:
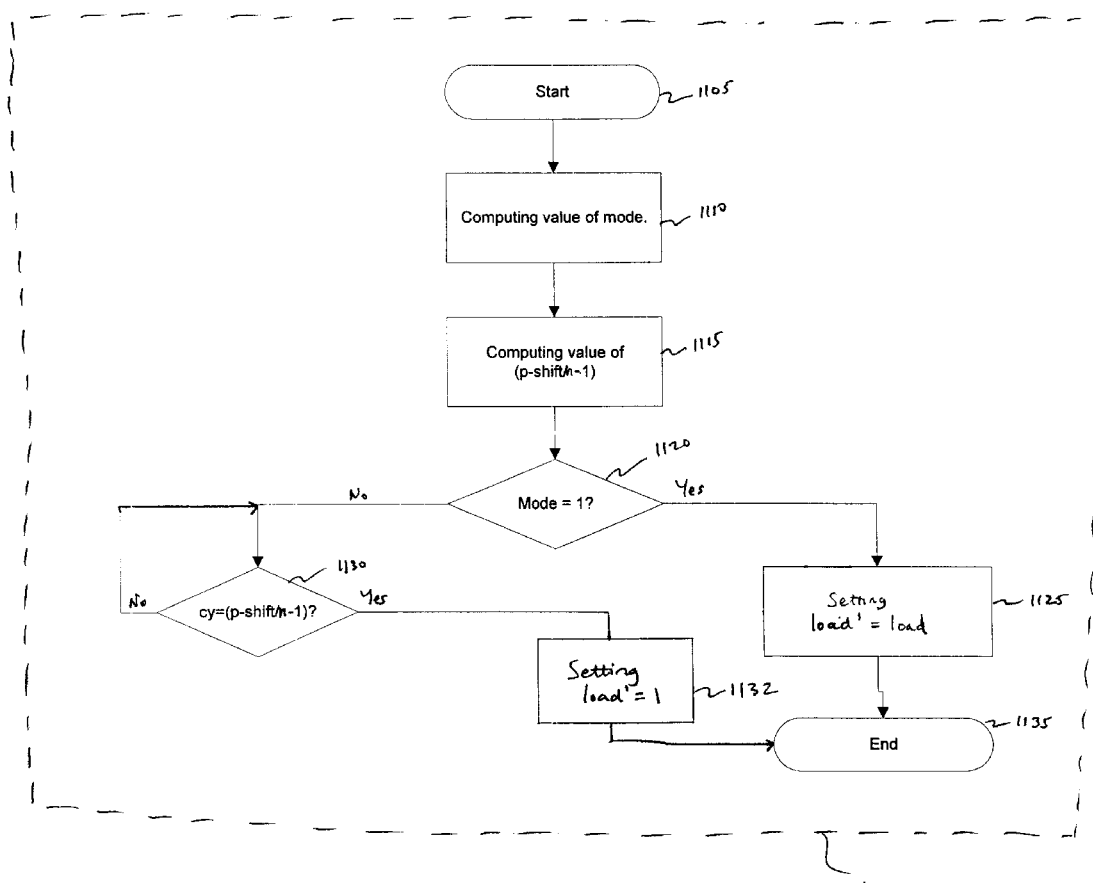
FIG. 11 is a flow diagram illustrating one method of determining when to load inputted data into the shift module in the second embodiment of the present invention.

FIG. 11 is a flow diagram illustrating one method of determining when to load input data 851 into the shift module 810. At the start 1105 of the operation, the control module 835 computes 1110 the value of mode 916 and computes 1115 the value of (p-shift/n−1), where p equals the number of available clock cycles, n equals the amount of shift imparted by the constant shift module 815 in a single clock cycle, and shift equals the shift value 855. The value (p-shift/n−1) helps to determine when to load the input data 851 into the shift module 810 in light of the amount of shift imparted by the constant shift module 815 in a single clock cycle which, in the embodiment shown in the Figures, is two bits (i.e., n=2). Note, however, that the constant shift need not equal two bits, but may equal any non-negative integer.

As further illustrated in FIG. 11, after the values of mode and (p-shift/n−1) have been computed, the delay load module 980 then determines 1120 whether the value of mode equals one. If the value of mode equals one, the delay load module 980 sets 1125 the load' signal 845 equal to the load signal 850, which results in the load module 805 loading the input data 851 into the shift module 810 if the load signal 850 equals one. If the value of mode does not equal one, the delay load module 980 determines 1130 whether the output of the counter of clock cycles, cy, equals (p-shift/n−1). If cy equals (p-shift/n−1), then the barrel shifter circuit 800 is at the appropriate clock cycle for loading the input data 851 into the shift module 810 in light of the remaining amount of shift needed to be imparted to the input data 851 and the amount of shift the constant shift module 815 and the elementary shifters are capable of adding in the remaining number of clock cycles. Therefore, the delay load module 980 sets 1132 the load' signal 845 equal to one. If cy does not equal (p-shift/n−1), then the delay load module 980 continues checking and waiting until a subsequent clock cycle equals (p-shift/n−1), at which point the load module 805 will load the input data 851 into the shift module 810.

Figure 12:
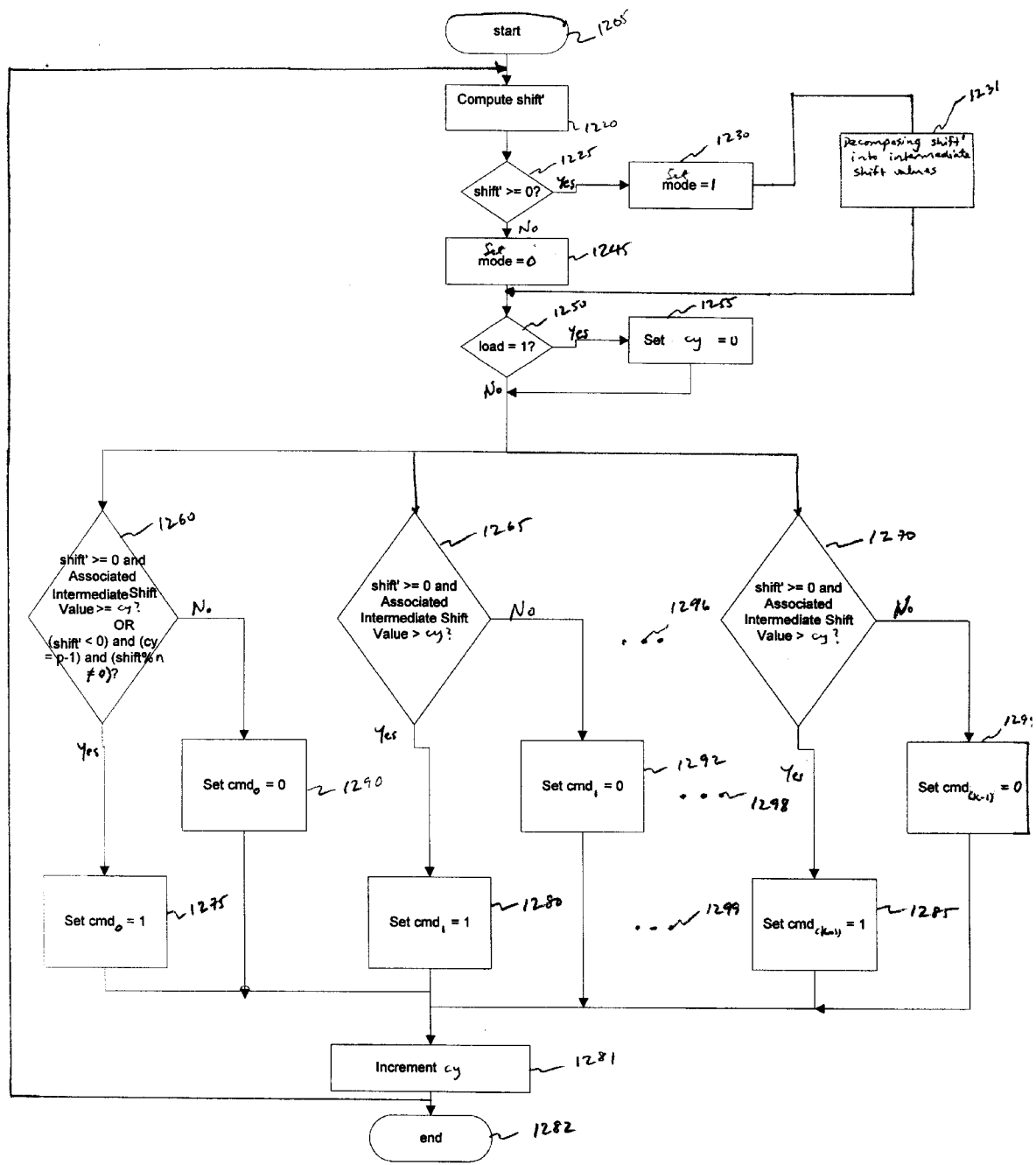
FIG. 12 is a flow diagram illustrating one method of computing the amount of shift for each elementary shifter for each clock cycle in the second embodiment of the present invention.

FIG. 12 is a flow diagram illustrating one method of computing the amount of shift for each elementary shifter for each clock cycle in the second embodiment of the present invention. At the start of the operation 1205, the control module 835 computes 1220 the value of shift' 906, and determines 1225 whether shift' 906 is greater than or equal to zero. If shift' 906 is greater than or equal to zero, the control module 835: (1) sets 1230 mode equal to one; and (2) decomposes 1231 shift' 906 into intermediate shift values 921, 926 and 931, one intermediate shift value for each elementary shifter, for input into the shift module 810. These intermediate shift values help the control module 835 produce command signals 934, 941 and 946 which cause the elementary shifters in the shift module 810 to produce shift in the amount of shift' over multiple clock cycles. If, however, shift' 906 is less than zero, the control module 835 simply sets 1245 mode to zero.

Next, the control module 835 determines 1250 whether the load signal 850 equals one. If the load signal 850 equals one, the counter 990 of clock cycles sets 1255 cy equal to zero. Comparator 920 then determines 1260 if (1) shift' 906 is greater than or equal to zero and the associated intermediate shift value 921 is greater than equal to cy, or (2) shift' 906 is less than zero and cy equals (p−2) and shift modulo two equals one. If either (1) or (2) is true, then the control module 835 sets 1275 $cmd_0$ 934 to one, which causes the most elementary shifter to add a one bit shift to the input data 851. In the first instance (i.e., when shift' >=0), the control module 835 permits the most elementary shifter to add a one bit shift to the input data 851 when the constant shift module 815 is unable to provide enough shift. In the second instance (i.e., when shift' <0), the control module 835 permits the most elementary shifter to add a one bit shift to the input data 851 when the constant shift module 815, which in the embodiment illustrated in FIG. 9 provides a constant shift of two bits, cannot provide enough shift because the requested shift is an odd number (ie., shift modulo 2=1). Hence, the control module 835 needs to impart an additional one bit shift to account for the fact that the constant shift module 815 can only impart an even number bits of shift. In the current embodiment, the additional one bit shift is added during the penultimate clock cycle (i.e., when cy=(p−2)). However, the additional shift may be imparted during any clock cycle from 0 to (p−2), not necessarily at clock cycle (p−2). Moreover, as noted above, the amount of constant shift imparted by the constant shift module need not equal two. If the amount of shift imparted by the constant shift module 815 is other than two, the enabler 995 for the most elementary shifter becomes enabled when shift' modulo n does not equal zero.

If, however, comparator 920 determines 1260 that neither (1) shift' 906 is greater than or equal to zero and the associated intermediate shift value 921 is greater than cy, nor (2) shift' 906 is less than zero and cy equals (p−1) and shift modulo two equals one, is true, then the control module 835 sets 1290 $cmd_0$ equal to zero.

As also shown in FIG. 12, comparators 926 and 931 determine 1265 and 1270 whether shift' 906 is greater than or equal to zero and each associated intermediate shift value, respectively 926 and 931, is greater than cy. If both conditions in the preceding sentence are true, the control module 835 sets 1280 and 1285 the associated command values 941 and 946 equal to one. Otherwise, the control module 835 sets 1292 and 1294 the associated command value 941 and 946 to zero, thereby inhibiting the associated elementary shifters from imparting additional shift to the input data 851.

Next, the counter 990 of clock cycles increments 1281 cy by one. The steps described in FIG. 12 then repeat themselves again. Note that ellipses 1296, 1298 and 1299 indicate that the number of intermediate shift values, comparators and command signals is variable, depending upon the number of elementary shifters in the shift module 810.

The above description is included to illustrate the operation of the preferred embodiments and is not meant to limit the scope of the invention. The scope of the invention is to be defined only by the following claims and equivalents thereof. From the above discussion, many variations will be apparent to one skilled in the art that would yet be encompassed by the spirit and scope of the present invention.

What is claimed is:

1. A barrel shifter circuit for shifting a data inputted into the circuit by a shift value, comprising:
    a shift module having at least one elementary shifter and for receiving the data inputted into the circuit and a command signal for each elementary shifter in the shift module;
    a load module for receiving a load signal and the data, the load module coupled to the shift module and configured to load the data into the shift module upon receipt of the load signal;
    a register module coupled to the shift module and to the load module, wherein the register module is a register for receiving a clock signal and configured to pass the data through the shift module with each clock cycle; and
    a control module coupled to the shift module and the load module, the control module for generating the command signal for each elementary shifter in the shift module for each clock cycle based upon the shift value, the command signal for determining the amount of shift applied to the data by the shift module during each clock cycle so that the total amount of shift applied to the data after multiple clock cycles equals the shift value.

2. The barrel shifter circuit of claim 1 wherein the shift module comprises a plurality of elementary shifters linked together serially in the following configuration: $(0, 1)+(0, p+1)+(0, (p+1)^2+ \ldots +(p+1)^{(k-1)}$, where p is the total number of available clock cycles, k is the number of elementary shifters and the command signal for each elementary shifter is one on each inputted data then zero for p−1 clock cycles.

3. The barrel shifter circuit of claim 1 wherein the elementary shifter comprises a plurality of coupled multiplexers and fixed shifters.

4. The barrel shifter circuit of claim 1 wherein the elementary shifter is an elementary shifter selected from the group consisting of: (A) a left shift elementary shifter; (B) a right shift elementary shifter; (C) a left rotate elementary shifter; and (D) a right rotate elementary shifter.

5. The barrel shifter circuit of claim 1 wherein the control module comprises:
    a decomposing module configured to decompose the shift value into at least one intermediate shift value;
    a counter of clock cycles having an output and two inputs, the first input being the load signal, the second input being the clock signal, and the output being a clock cycle computed by the counter; and
    at least one comparator, each comparator coupled to the decomposing module and the output of the counter of clock cycles, each comparator configured to produce the command signal for an elementary shifter based upon a comparison of the corresponding intermediate shift value and the output of the counter of clock cycles.

6. The barrel shifter circuit of claim 5 wherein the counter comprises:
    at least one register for receiving the clock signal;
    an incrementer coupled to the register, the incrementer configured to increment the output of the counter by one; and
    a multiplexer coupled to the incrementer, the register and the comparators, the multiplexer configured to select one of two inputs based upon a control signal, which control signal is the load signal, the first input of the multiplexer being zero and the second input being the output of the register.

7. The barrel shifter circuit of claim 5 wherein the decomposing module decomposes the shift value into at least one intermediate shift value using the following formula:

$$sh_i = [\text{shift}/(p+1)^i]\%(p+1)$$

where $sh_i$ is the intermediate shift value associated with an elementary shifter, shift is the shift value inputted into the circuit, "/" means integer division, "%" means modulo, i equals an integer value from 0 to k−1, and k equals the number of elementary shifters in the shift module.

8. A method for shifting a data inputted into a barrel shifter circuit by a shift value, comprising the steps of:
    loading the data into a shift module, the shift module including at least one elementary shifter, upon receipt of a load signal;
    loading the shift value into a control module upon receipt of the load signal;
    computing an amount of shift for each elementary shifter in the shift module for each clock cycle based upon the shift value; and
    passing the inputted data through the shift module until new data is loaded into the circuit.

9. The method of claim 8 wherein the step of computing an amount of shift for each elementary shifter for each clock cycle based upon the shift value comprises the substeps of:
    decomposing the shift value into intermediate shift values, one intermediate shift value for each elementary shifter, for input into the shift module; and
    generating an amount of shift for each intermediate shift value per clock cycle so that the total amount of shift produced by the shift module by the end of the total number of available clock cycles equals the shift value.

10. The method of claim 9 wherein the step of decomposing the shift value into intermediate shift values is accomplished using the following formula:

$$sh_i=[shift/(p+1)^i]\%(p+1)$$

where $sh_i$ is the intermediate shift value associated with an elementary shifter, shift is the shift value inputted into the circuit, "/" means integer division, "%" means modulo, i equals an integer value from 0 to k−1, and k equals the number of elementary shifters in the shift module.

11. The method of claim 9 wherein the step of generating an amount of shift for each intermediate shift value per clock cycle comprises the substeps of:
  (a) comparing the load signal to one;
  (b) setting the output of a counter of clock cycles, cy, equal to zero when load signal equals one;
  (c) comparing an associated intermediate shift value for each elementary shifter with cy;
  (d) setting a command signal for each elementary shifter to one where the associated intermediate shift value is equal to or greater than cy;
  (e) setting the command signal for each elementary shifter to zero where the associated intermediate shift value is less than cy;
  (f) incrementing cy by one; and
  (g) repeating steps (a) through (f).

12. A barrel shifter circuit for shifting a data inputted into the circuit by a shift value, comprising:
  means for loading the data inputted into the circuit upon receipt of a load signal;
  means for loading the shift value into a control module upon receipt of the load signal;
  means for computing an amount of shift for each elementary shifter for each clock cycle based upon the shift value; and
  means for passing the data inputted into the circuit through a shift module until new data is loaded into the circuit.

13. A barrel shifter circuit for shifting a data inputted into the circuit by a shift value, comprising:
  a shift module having at least one elementary shifter and for receiving the data inputted into the circuit;
  a load module for receiving a load signal and the data, the load module coupled to the shift module and configured to load the data into the shift module upon receipt of the load signal;
  a register module coupled to the shift module and to the load module, wherein the register module is a register for receiving a clock signal and configured to pass the data through the shift module with each clock cycle;
  a constant shift module coupled to the register module and the shift module and configured to shift the data by a constant amount with each clock cycle; and
  a control module coupled to the shift module and the load module, the control module for generating a command signal for each elementary shifter in the shift module for each clock cycle based upon the shift value, the command signal for determining the amount of shift applied to the data by the shift module during each clock cycle so that the total amount of shift applied to the data after multiple clock cycles equals the shift value.

14. The barrel shifter circuit of claim 13 wherein the constant shift module comprises a shifter for shifting the data output by the shift module by two bits.

15. The barrel shifter circuit of claim 13 wherein the control module comprises:
  a decomposing module for receiving the load signal and shift' and configured to decompose shift' into one or more intermediate shift values;
  a counter of clock cycles having an output and two inputs, the first input being the load signal, the second input being the clock signal, and the output being a clock cycle computed by the counter;
  at least one comparator, each comparator coupled to the decomposing module and the output of the counter of clock cycles, each comparator configured to produce the command signal for an elementary shifter based upon a comparison of the corresponding intermediate shift value and the output of the counter of clock cycles;
  a shift module enabler coupled to the counter and comparator, and configured to enable the elementary shifters in the shift module to add the appropriate amount of shift to the data; and
  a delay load module coupled to the shift module enabler and the load module, the delay load module configured to send a signal to the load module at the appropriate clock cycle so that the data is shifted by the shift value.

16. The barrel shifter circuit of claim 15 wherein the decomposing module decomposes shift' into at least one intermediate shift value using the following formula:

$$sh_i'=[shift'/(p+1)^i]\%(p+1)$$

where "/" means integer division, "%" means modulo, p is the number of available clock cycles, i equals an integer value between 0 and k−1, k is the number of elementary shifters in the shift module of the circuit, shift'=the shift value−n(p−1), and n equals the amount of shift imparted by the constant shift module to the data in a single clock cycle.

17. The barrel shifter circuit of claim 15 wherein the delay load module comprises:
  a module for computing a delay load value, wherein the delay load value is
    (p−shift/n−1)
  where p is the number of available clock cycles, shift is the shift value inputted into the circuit, and n is the amount of constant shift imparted by the constant shift module to the data in a single clock cycle;
  a delay load module comparator configured to compare a first signal with a second signal, the first signal being the output of the counter of clock cycles and the second signal being the delay load value; and
  a delay load module multiplexer configured to select one of two inputs, the first input being the output of the delay load module comparator and the second input being the load signal, based upon a control signal, which control signal has the value of mode.

18. The barrel shifter circuit of claim 17 wherein n in the delay load value equals two.

19. The barrel shifter circuit of claim 15 wherein the shift module enabler comprises:
  a mode compute module for computing the value of mode, wherein the value of mode is one when shift−n(p−1)>=0 and zero otherwise, where n is the amount of constant shift imparted by the constant shift module to the data in a single clock cycle, p is the number of available clock cycles, and shift equals the shift value inputted into the circuit;
  at least one shift module multiplexer, one shift module multiplexer for each elementary shifter in the shift module, each shift module multiplexer coupled to a corresponding elementary shifter, each shift module multiplexer configured to select one of two inputs based upon a control signal, which control signal is the output of the mode compute module, the first input being zero if the associated shift module multiplexer is other than the most elementary shifter and the second input of each shift module multiplexer being the output of the associated comparator; and an enabler for the most elementary shifter configured to add additional shift to the data during one of the multiple clock cycles, the enabler coupled to the first input of the shift module multiplexer associated with the most elementary shifter.

20. The barrel shifter circuit of claim 19 wherein the value of the enabler is one when the output of the counter of clock cycles equals (p−2) and shift' modulo n does not equal zero.

21. The barrel shifter circuit of claim 19 wherein n equals two.

22. The barrel shifter circuit of claim 19 wherein the most elementary shifter is an elementary shifter configured to shift the data by zero or one bit, depending upon the value of its control signal whose value is mode.

23. A method for shifting a data inputted into a barrel shifter circuit by a shift value, comprising the steps of:

loading the shift value into a control module;

determining when to load the data inputted into the circuit into a shift module using a delay load module;

loading the data into the shift module, the shift module including at least one elementary shifter, at the appropriate clock cycle using a load module;

computing an amount of shift for each elementary shifter in the shift module for each clock cycle based upon the shift value and an amount of shift imparted by a constant shift module using the control module; and passing the data through the shift module and the constant shift module for the remaining number of clock cycles until a new data is inputted into the circuit.

24. The method of claim 23 wherein the steps of determining when to load the data and loading the data into the shift module comprise the substeps of:

(a) computing mode;

(b) computing (p−shift/n−1), where p equals the number of available clock cycles, n equals the amount of shift imparted by the constant shift module in a single clock cycle, and shift equals the shift value;

(c) determining whether mode equals one;

(d) when mode equals one, setting load' equal to load;

(e) when mode does not equal one, determining whether the output of the counter of clock cycles, cy, equals (p−shift/n−1);

(f) when cy equals (p−shift/n−1), setting load' equal to one which loads the data into the shift module; and (g) when cy does not equal (p−shift/n−1), repeating steps (e) through (g).

25. The method of claim 23 wherein the step of computing the amount of shift for each elementary shifter for each clock cycle comprises the substeps of:

(a) computing shift';

(b) determining whether shift' is greater than or equal to zero;

(d) when shift' is greater than or equal to zero,
  (I) setting mode to one, and
  (II) decomposing shift' into intermediate shift values, one intermediate shift value for each elementary shifter, for input into the shift module;

(e) when shift' is less than zero, setting mode to zero;

(f) determining whether a load signal equals one;

(g) when the load signal equals one, setting the output of the counter of clock cycles, cy, equal to zero;

(h) comparing the load signal to one;

(i) setting a counter to zero when the load signal equals one;

(j) when either (I) shift' is greater than or equal to zero and the associated intermediate shift value is greater than or equal to cy, or (II) shift' is less than zero and shift modulo n does not equal zero, where n is the amount of shift imparted by the constant shift module in a single clock cycle, setting a command value for the most elementary shifter, $cmd_0$, equal to one;

(k) otherwise, setting the command value for the most elementary shifter, $cmd_0$, equal to zero;

(l) setting a command value for any other elementary shifters equal to one when shift' is greater than or equal to zero and the associated intermediate shift value is greater than cy;

(m) otherwise, setting the command values for any other elementary shifters equal to zero;

(n) incrementing cy by one; and (o) repeating steps (a)–(n).

26. The method of claim 25 wherein the step of decomposing shift' into intermediate shift values is accomplished using the following formula:

$$sh_i' = [shift'/(p+1)^i] \% (p+1)$$

where $sh_i'$ is an intermediate shift value associated with an elementary shifter, "/" means integer division, "%" means modulo, i equals an integer value from 0 to k−1, and k equals the number of elementary shifters in the shift module.

27. A barrel shifter circuit for shifting data inputted into the circuit by a variable amount. comprising:

means for loading a shift value into a control module;

means for determining when to load the data inputted into the circuit into a shift module using a delay load module;

means for loading the data into the shift module at the appropriate clock cycle using a load module;

means for computing an amount of shift for each elementary shifter for each clock cycle based upon the shift value and an amount of shift imparted by a constant shift module using a control module; and means for passing the data through the shift module and the constant shift module for the remaining number of clock cycles until a new data is inputted into the circuit.

* * * * *